(12) United States Patent
Kawasaki et al.

(10) Patent No.: US 8,432,380 B2
(45) Date of Patent: Apr. 30, 2013

(54) DISPLAY APPARATUS AND INFORMATION PROCESSING APPARATUS USING THE SAME

(75) Inventors: Somei Kawasaki, Saitama (JP); Takanori Yamashita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 979 days.

(21) Appl. No.: 12/091,230

(22) PCT Filed: Jun. 29, 2007

(86) PCT No.: PCT/JP2007/063529
§ 371 (c)(1),
(2), (4) Date: Apr. 23, 2008

(87) PCT Pub. No.: WO2008/001957
PCT Pub. Date: Jan. 3, 2008

(65) Prior Publication Data
US 2009/0121980 A1    May 14, 2009

(30) Foreign Application Priority Data

Jun. 30, 2006  (JP) ................................ 2006-181666

(51) Int. Cl.
*G06F 3/038* (2006.01)
*G09G 5/00* (2006.01)

(52) U.S. Cl.
USPC .............. 345/204; 345/76; 345/80; 345/205; 345/82; 438/488

(58) Field of Classification Search .......... 345/204–215, 345/1.1–111, 690–699; 315/169.3; 438/488
See application file for complete search history.

(56) References Cited

U.S. PATENT DOCUMENTS

| 6,057,183 | A | 5/2000 | Koyama et al. |
| 6,501,448 | B1* | 12/2002 | Komiya et al. ................. 345/80 |
| 6,646,637 | B1* | 11/2003 | Kageyama et al. ........... 345/204 |
| 6,771,028 | B1* | 8/2004 | Winters ..................... 315/169.1 |
| 6,781,153 | B2 | 8/2004 | Anzai |

(Continued)

FOREIGN PATENT DOCUMENTS

| EP | 1 473 778 | 11/2004 |
| JP | 8-062637 A | 3/1996 |
| JP | 2003-168570 A | 6/2003 |

*Primary Examiner* — Lun-Yi Lao
*Assistant Examiner* — Gene W Lee
(74) *Attorney, Agent, or Firm* — Fitzpatrick, Cella, Harper & Scinto

(57) ABSTRACT

A display apparatus includes a plurality of luminescent devices aligned periodically in a row direction and in a column direction, a plurality of pixel circuits aligned periodically in a row direction and in a column direction for supplying an electric current to each of the luminescent devices, a plurality of data lines each connected commonly to the pixel circuits aligned periodically in the column direction for supplying signal currents to these pixel circuits, and a plurality of column-current generating circuits connected to the plurality of data lines respectively for supplying signal currents to corresponding data lines. Each of the column-current generating circuits have a plurality of transistor devices arranged in a distributed manner and including main electrodes respectively connected in parallel and control electrodes commonly connected. The plurality of transistor devices are arranged in the row direction at a pitch equal to or n times, with n being a natural number not smaller than two, of the alignment period in the row direction of the plurality of luminescent devices and arranged in the column direction at a constant pitch.

11 Claims, 14 Drawing Sheets

U.S. PATENT DOCUMENTS

| | | | |
|---|---|---|---|
| 6,791,539 B2* | 9/2004 | Nakajima et al. | 345/204 |
| 6,798,148 B2* | 9/2004 | Inukai | 315/169.3 |
| 6,946,801 B2* | 9/2005 | Kitahara | 315/169.3 |
| 6,954,194 B2* | 10/2005 | Matsumoto et al. | 345/92 |
| 7,015,057 B2 | 3/2006 | Koyama et al. | |
| 7,027,022 B2 | 4/2006 | Koyama et al. | |
| 7,119,769 B2* | 10/2006 | Abe et al. | 345/76 |
| 7,126,565 B2 | 10/2006 | Kawasaki et al. | |
| 7,157,847 B2 | 1/2007 | Kawachi et al. | |
| 7,196,747 B2 | 3/2007 | Koo et al. | |
| 7,242,397 B2 | 7/2007 | Iseki et al. | 345/204 |
| 7,382,384 B2* | 6/2008 | Winters et al. | 345/695 |
| 7,459,355 B2 | 12/2008 | Koyama et al. | |
| 7,675,232 B2 | 3/2010 | Kawachi et al. | |
| 7,764,252 B2* | 7/2010 | Miller et al. | 345/77 |
| 8,179,357 B2* | 5/2012 | Otose | 345/100 |
| 2001/0003477 A1 | 6/2001 | Aoki et al. | |
| 2001/0011970 A1 | 8/2001 | Koyama et al. | |
| 2002/0053671 A1 | 5/2002 | Koyama | |
| 2002/0084746 A1 | 7/2002 | Anzai | |
| 2003/0071803 A1 | 4/2003 | Yamazaki et al. | |
| 2003/0164685 A1* | 9/2003 | Inukai | 315/169.3 |
| 2003/0189535 A1* | 10/2003 | Matsumoto et al. | 345/76 |
| 2003/0193492 A1* | 10/2003 | Koyama | 345/204 |
| 2003/0227447 A1* | 12/2003 | Takeuchi et al. | 345/204 |
| 2004/0032217 A1* | 2/2004 | Abe et al. | 315/169.3 |
| 2004/0104909 A1 | 6/2004 | Kawasaki et al. | |
| 2004/0150350 A1* | 8/2004 | Inukai | 315/169.3 |
| 2004/0183752 A1 | 9/2004 | Kawasaki et al. | 345/20 |
| 2004/0183922 A1* | 9/2004 | Imamura et al. | 348/222.1 |
| 2004/0239379 A1* | 12/2004 | Inukai | 327/108 |
| 2005/0007361 A1* | 1/2005 | Fujikura et al. | 345/204 |
| 2005/0012703 A1 | 1/2005 | Yamazaki et al. | |
| 2005/0024300 A1* | 2/2005 | Abe et al. | 345/76 |
| 2005/0046619 A1* | 3/2005 | Senda et al. | 345/76 |
| 2005/0122150 A1 | 6/2005 | Iseki et al. | 327/215 |
| 2005/0225253 A1* | 10/2005 | Yamada et al. | 315/169.3 |
| 2005/0253531 A1* | 11/2005 | Matsumoto et al. | 315/169.3 |
| 2005/0285151 A1 | 12/2005 | Kawasaki | 257/213 |
| 2006/0114194 A1 | 6/2006 | Kawasaki et al. | 345/76 |
| 2006/0114195 A1 | 6/2006 | Yamashita et al. | 345/76 |
| 2006/0119556 A1* | 6/2006 | Winters et al. | 345/82 |
| 2006/0132395 A1 | 6/2006 | Kawasaki et al. | 345/75.2 |
| 2006/0170628 A1* | 8/2006 | Yamashita et al. | 345/76 |
| 2006/0170712 A1* | 8/2006 | Miller et al. | 345/695 |
| 2007/0146252 A1* | 6/2007 | Miller et al. | 345/77 |
| 2009/0009440 A1 | 1/2009 | Kawachi et al. | |

\* cited by examiner

DISPLAY APPARATUS AND INFORMATION PROCESSING APPARATUS USING THE SAME

TECHNICAL FIELD

This invention relates to a display apparatus and an information processing apparatus using the same. More particularly, the present invention relates to a display apparatus having a plurality of column-current generating circuits for supplying signal currents respectively to a plurality of columns of luminescent devices that are two-dimensionally aligned and an information processing apparatus using the same.

BACKGROUND ART

An EL device is a luminescent device that emits light when an electric current is injected and a current setting type light emission control system can be used for a luminescent device.

FIG. 11 of the accompanying drawings schematically illustrates the configuration of a current setting type pixel circuit including an EL device. The part other than the EL device in FIG. 11 is the pixel circuit. In FIG. 11, P11 and P12 denote scan signals. On the other hand, current data "Idata" is input as an information signal.

The anode (A in FIG. 11) of the EL device is connected to the drain terminal of thin film transistor (TFT) MP4, while the cathode (K in FIG. 11) of the EL device is connected to the grounding potential GND. MP1, MP2 and MP4 are p-type thin film transistors (PMOS transistors) and MP3 is an n-type thin film transistor (NMOS transistor). Now, the operation of the pixel circuit will be described below.

When current data "Idata" is input, a LOW level signal is input to a scanning line 104 as a scan signal P11, while a HIGH level signal is input to a scanning line 105 as a scan signal P12. At this time, the transistors MP2 and MP3 are brought into an ON state, while the transistor MP4 is brought into an OFF state. Since the transistor MP4 is not in a conducting state, no electric current flows to the EL device. A voltage that corresponds to the electric current driving capability of the transistor MP1 is produced by the current data "Idata" at capacity C arranged between the gate terminal of the transistor MP1 and the power supply voltage "Vcc". In this way, the electric current that is made to flow to the EL device is retained as the potential of the gate of the transistor MP1.

When supplying an electric current to the EL device, a HIGH level signal is input as a scan signal P11, while a LOW level signal is input as a scan signal P12. At this time, the transistor MP4 is brought into an ON state, while the transistors MP2 and MP3 are brought into an OFF state. Since the transistor MP4 is in conducting state, an electric current that corresponds to the electric current driving capability of the transistor MP1 is supplied to the EL device by the voltage produced at the capacity C and the EL device emits light with a luminescence intensity that corresponds to the supplied electric current.

FIG. 12 of the accompanying drawings illustrates the circuit configuration of an EL display apparatus formed by arranging pixel circuits and EL devices respectively in the row direction and in the column direction to form a two-dimensional matrix.

R(red)/G(green)/B(blue) input video signal 210 (to be referred to simply as an input video signal hereinafter) is input to a series of column-current generating circuits 201, the number of which is three times as many as the horizontal pixels of the EL panel. Subsequently, horizontal control signal 211a is input to an input circuit 206 and horizontal control signal 211 is output from the input circuit 206 and input to a horizontal shift register 203.

Auxiliary column control signal 213a is input to an input circuit 208 and auxiliary column control signal 213 is output from the input circuit 208 and input to gate circuits 204 and 216.

Horizontal sampling signal group 217 outputs to the output terminals that correspond to the respective columns of the horizontal shift register 203 is input to a gate circuit 215 where control signal 211 output from the gate circuit 216 is input. The horizontal sampling signal group 218 transformed by the gate circuit 215 is input to the column-current generating circuit 201. The column-current generating circuit 201 is controlled by a control signal 219 output from the gate circuit 204.

Vertical control signal 212a is input to an input circuit 207 and a vertical control signal 212 is output from the input circuit 207 and input to a vertical shift register 205, while scanning signals are input to row control lines 304.

A data signal from the column-current generating circuit 201 is input to each pixel circuit by way of a data line 302. In FIG. 12, a pixel region 209 is formed by pixel circuits and EL devices.

FIG. 13 of the accompanying drawings schematically illustrates an exemplar circuit configuration of the column-current generating circuit 201. FIG. 14 of the accompanying drawings is a timing chart of the operation of the column-current generating circuit 201. The circuit is disclosed in U.S. Pat. No. 7,126,565. Since the configuration and the operation of the circuit are disclosed in detail in the above-cited patent document, they will be described here only summarily.

The column-current generating circuits 201 transform video signal "video" as an input signal into current signal "Idata" and outputs the current signal "Idata".

Video signal video is input from the signal input terminals, which are the source of the transistor M1 and the source of the transistor M7. Horizontal sampling signals "SPa" and "SPb" are input respectively to the gates of the transistor M1 and the transistor M7.

The drain of the transistor M1 is connected to one of the terminals of the capacity C1. The other terminal of the capacity C1 is connected to the drain of the transistor M2, the gate of the transistor M3 and one of the terminals of capacity C2. The drain of the transistor M3 and the other terminal of the capacity C2 are connected to GND. Control signal "P1" is input to the gate of the transistor M2.

The source of the transistor M2 and the source of the transistor M3 are connected to the drain of the transistor M4 and that of the transistor M6. Control signals "P2" and "P3" are input respectively to the gate of the transistor M4 and the gate of the transistor M6.

Current signal "Idata" is output from the source of the transistor M6 that is a signal output terminal to the data line. The source of the transistor M4 is connected to the power supply "Vcc" by way of the transistor M5.

While the circuit configuration downstream to the drain of the transistor M1 is described above, the circuit configuration downstream to the drain of the transistor M7 has similar configuration. In other words, the capacities C1 and C2 and the transistors M2 through M6 correspond respectively to capacities C3 and C4 and transistors M8 through M12. The circuit of the transistors M1 through M6 and the capacities C1 and C2 may be used for writing on the odd number pixel rows, whereas the circuit of the transistors M7 through M12 and the capacities C3 and C4 may be used for writing on the even number pixel rows.

To improve the response speed of a thin film transistor (TFT), polysilicon (p-Si) that shows an electron mobility higher than amorphous silicon (a-Si) is desirably used. To form a polysilicon layer on an insulating substrate such as a glass substrate, generally, the substrate is irradiated with a laser beam such as an excimer laser beam in order to heat and melt a-Si on the substrate and recrystallize a-Si into p-Si.

U.S. Pat. No. 6,781,153 discloses a technique of forming transistors of the pixel circuit of an organic EL display apparatus by connecting a plurality of TFTs in parallel in order to suppress the dispersion of characteristics attributable to laser anneal using a laser beam.

When transistors having a non-single-crystal semiconductor film such as polysilicon film as an active layer are adopted in a column-current generating circuit as illustrated in FIG. 13, the dispersion of crystal grain size gives rise to dispersion of the electric characteristics of the transistors including the amplification factor. Then, as a result, the electric current supplied by the column-current generating circuit shows dispersion, which by turn may produce non-uniformity of display such as vertical streaks appearing in the image being displayed by the EL devices.

DISCLOSURE OF THE INVENTION

The present invention provides a display apparatus comprising a plurality of luminescent devices aligned periodically in a row direction and in a column direction and a plurality of column-current generating circuits for supplying signal currents to respective columns of the plurality of luminescent devices, each of the column-current generating circuits having a plurality of transistor devices arranged in a distributed manner and including main electrodes respectively connected in parallel and control electrodes commonly connected, the plurality of transistor devices being capable of retaining a signal as an electric potential of the commonly connected control electrodes and outputting a signal current corresponding to the electric potential from the main electrodes connected in parallel, the plurality of transistor devices being arranged in the row direction at a pitch equal to or n times (n being a natural number not smaller than two) of the alignment period in the row direction of the plurality of luminescent devices and arranged in the column direction at a constant pitch.

In another aspect of the present invention, there is provided a column-current generating circuit provided for each column of a plurality of functional devices aligned in a row direction and in a column direction on a substrate for supplying signal currents to the plurality of functional devices, wherein the column-current generating circuit has a plurality of thin film transistors having gates commonly connected, sources and drains connected in parallel and semiconductor layers dispersed in the row direction of alignment of the plurality of functional devices.

In still another aspect of the present invention, there is provided a display apparatus comprising a plurality of luminescent devices, a plurality of pixel circuits, the luminescent devices and the pixel circuits being aligned in a row direction and in a column direction, and column-current generating circuits for converting voltages into currents and supplying the currents to the respective columns of the plurality of pixel circuits, each of the column-current generating circuits including a plurality of transistors for converting voltages into electric currents, the transistors having gates commonly connected, sources and drains connected in parallel and semiconductor layers dispersed in the row direction of alignment of the plurality of pixel circuits.

For the purpose of the present invention, the transistor devices desirably have an active layer made of a non-single-crystal semiconductor.

Thus, a display apparatus according to the present invention can apparently suppress the dispersion of the electric characteristics of the transistors of the column-current generating circuits including the amplification factor and the threshold value. Then, as a result, dispersions of the signal currents produced by converting the input signal voltages that correspond to equivalent luminescence intensities and supplied from the column-current generating circuits can be suppressed and hence the vertical streaks, if any, appearing in the image being displayed by the electro-optic devices can be controlled.

The effect of suppressing the non-uniformity of signal currents can improve the uniformity of the operations of not only the electro-optic devices but also the functional devices (including luminescent devices, transistor devices and transistor circuits) that are driven by an electric current as a load.

Other features and advantages of the present invention will be apparent from the following description taken in conjunction with the accompanying drawings, in which like reference characters designate the same or similar parts throughout the figures thereof.

BEST MODE FOR CARRYING OUT THE INVENTION

Preferred embodiments of the present invention will now be described in detail in accordance with the accompanying drawings.

(First Embodiment)

Figure 11:
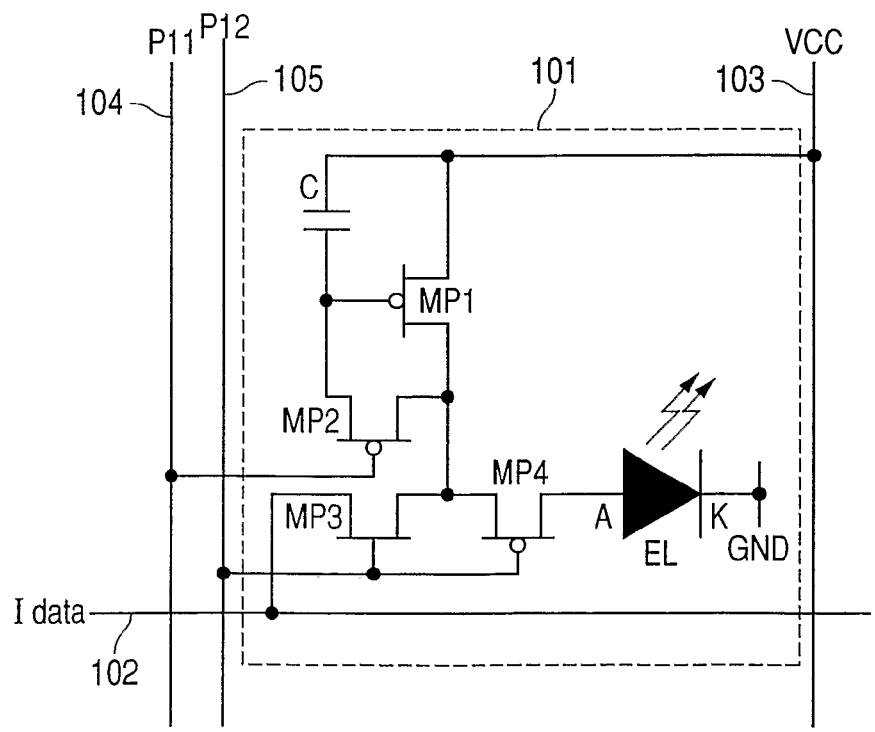
FIG. 11 is a schematic circuit diagram of a current setting type pixel circuit including an EL device, illustrating the configuration thereof.
Figure 12:
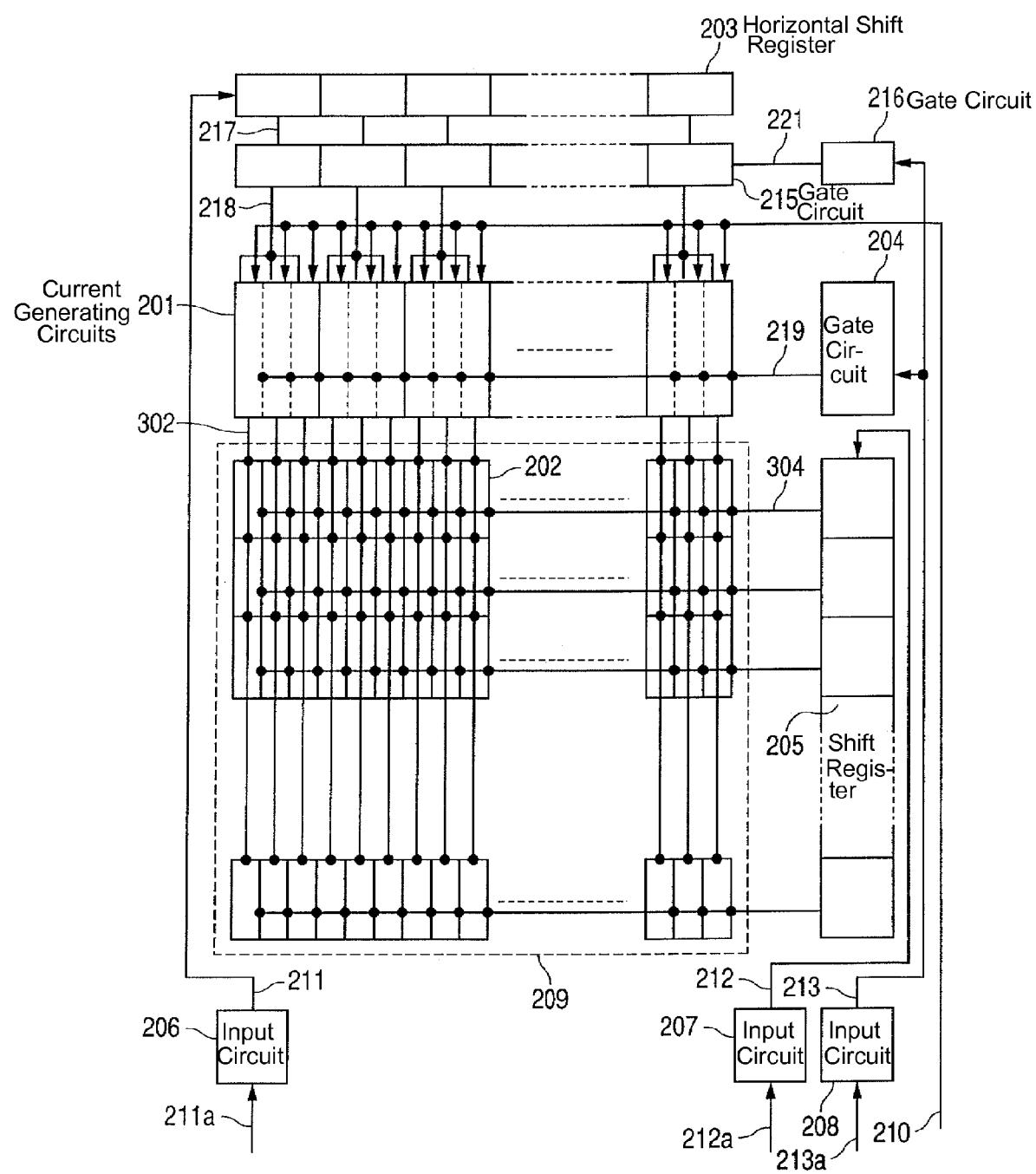
FIG. 12 is a schematic circuit diagram of an EL display apparatus where EL devices and pixel circuits are two-dimensionally aligned, illustrating the configuration thereof.

The display apparatus of this embodiment will be described below, referring also to a comparative example. The display apparatus of this embodiment includes pixel circuits as functional devices and EL devices as electro-optic devices. The circuit configuration of each pixel circuit, that of the EL display apparatus and that of each column-current generating circuit of this embodiment are the same as those illustrated in FIGS. 11, 12 and 13 and hence will not be described here.

Figure 1:
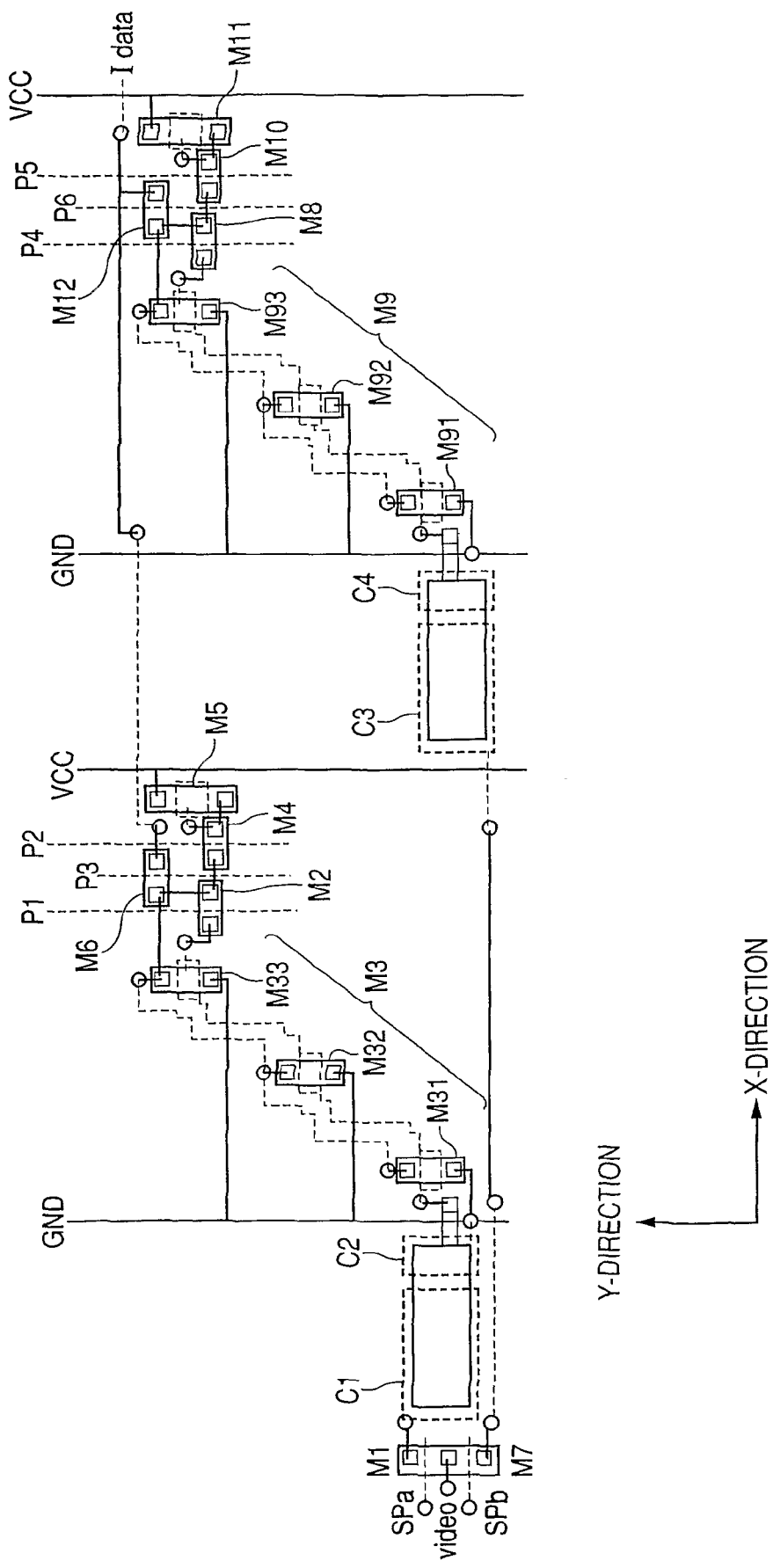
FIG. 1 is a schematic illustration of the layout of a column-current generating circuit of an embodiment of display apparatus according to the present invention produced as a designed pattern.
Figure 2:
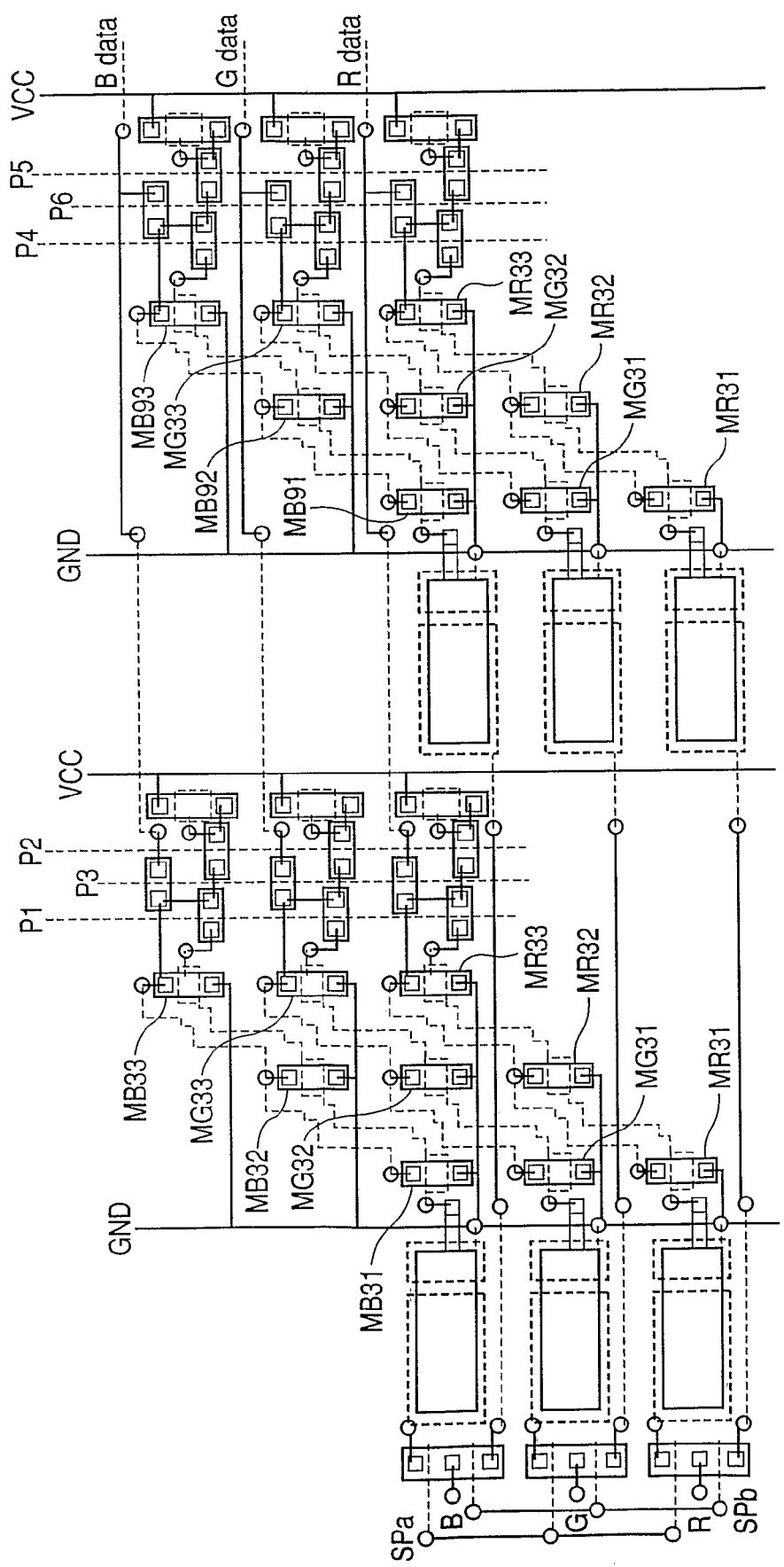
FIG. 2 is a schematic illustration of the circuit configuration of column-current generating circuits of three columns for displaying an image in three colors (RGB) on an embodiment of display apparatus according to the present invention.
Figure 3:
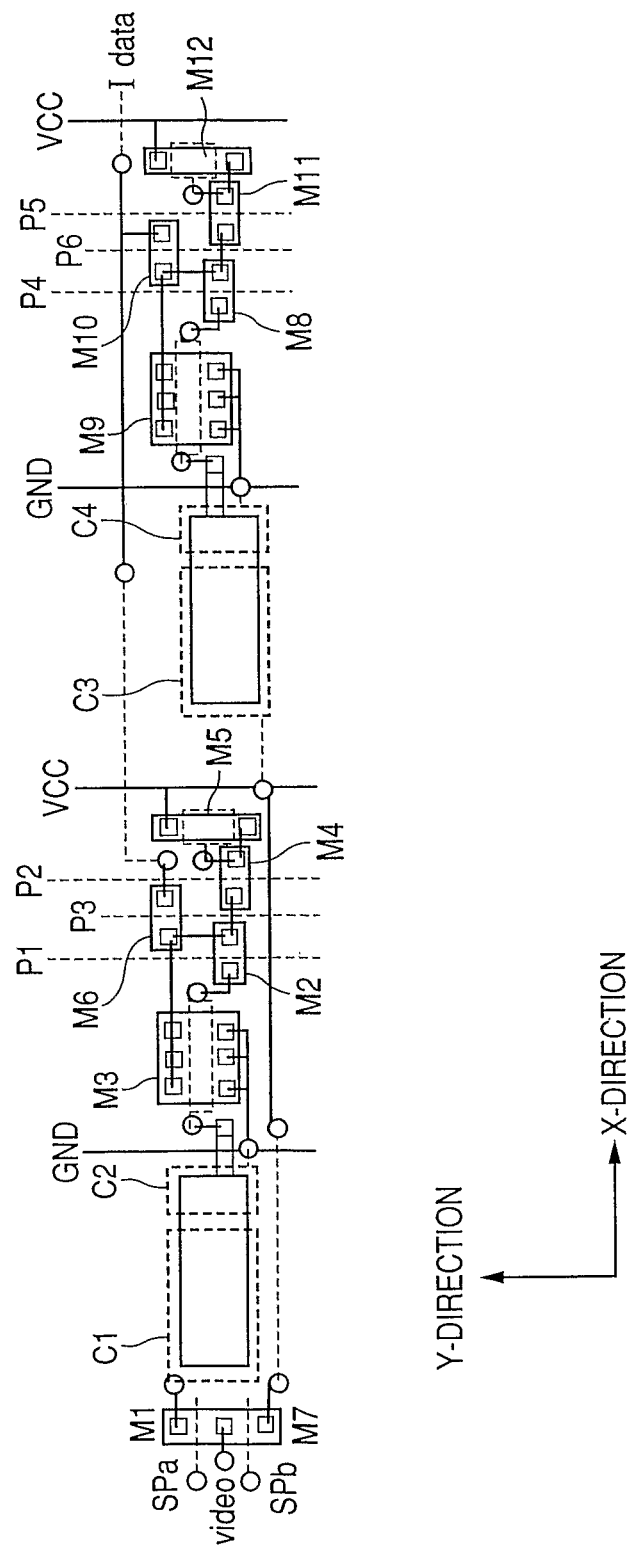
FIG. 3 is a schematic illustration of the layout of a column-current generating circuit of a display apparatus of a comparative example produced as a designed pattern.
Figure 4:
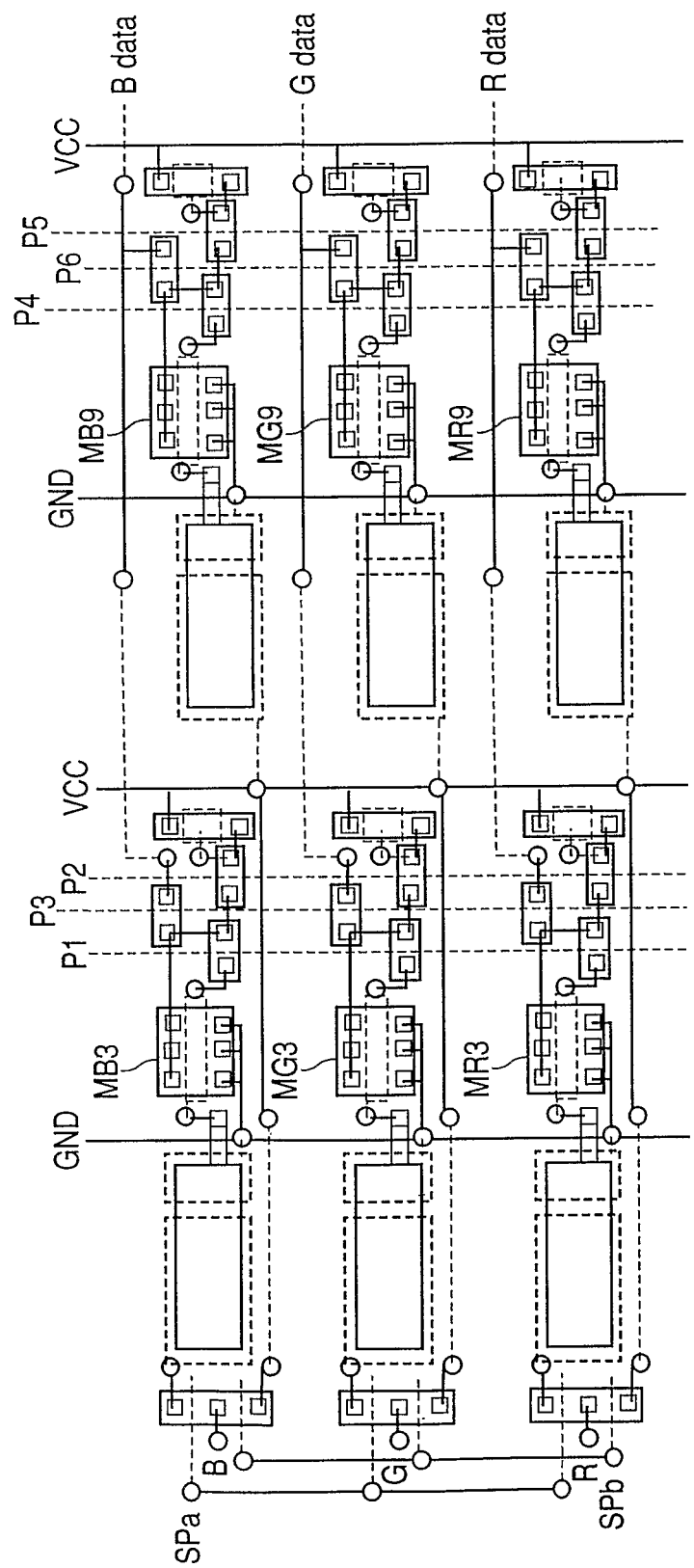
FIG. 4 is a schematic illustration of the circuit configuration of column-current generating circuits of three columns for displaying an image in three colors (RGB) on a display apparatus of a comparative example.
Figure 13:
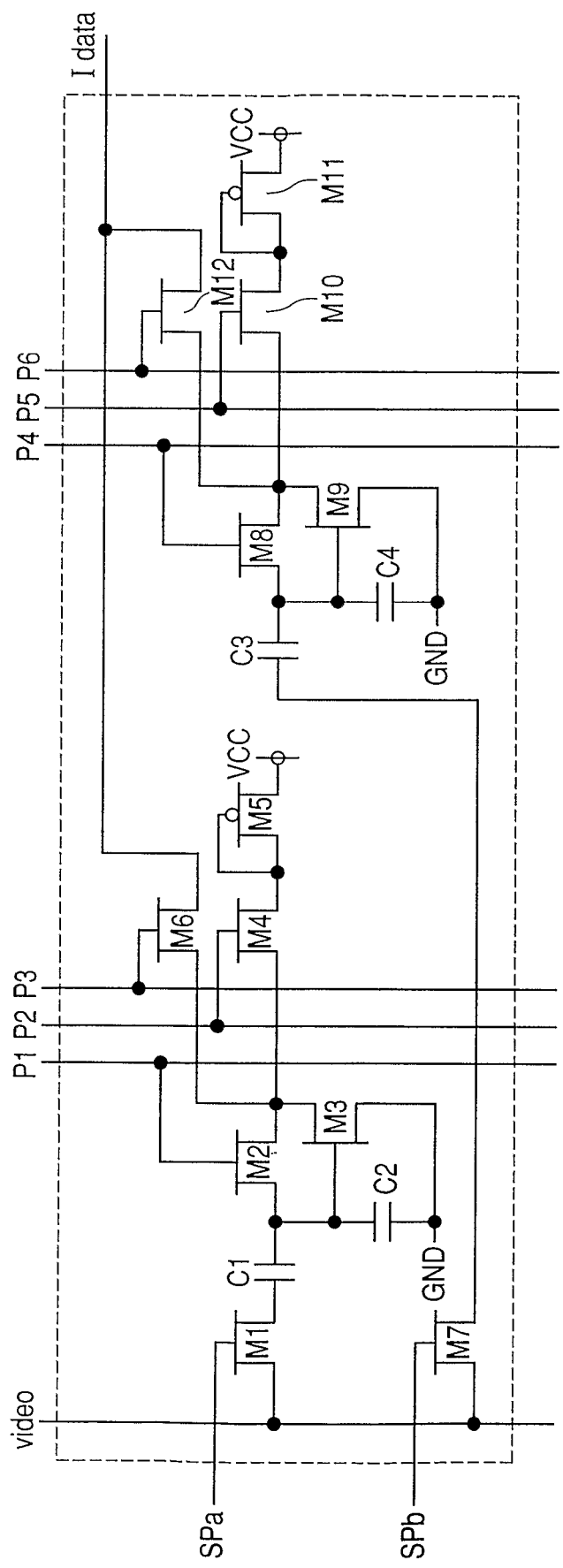
FIG. 13 is a schematic circuit diagram of an exemplar column-current generating circuit, illustrating the configuration thereof.
Figure 14:
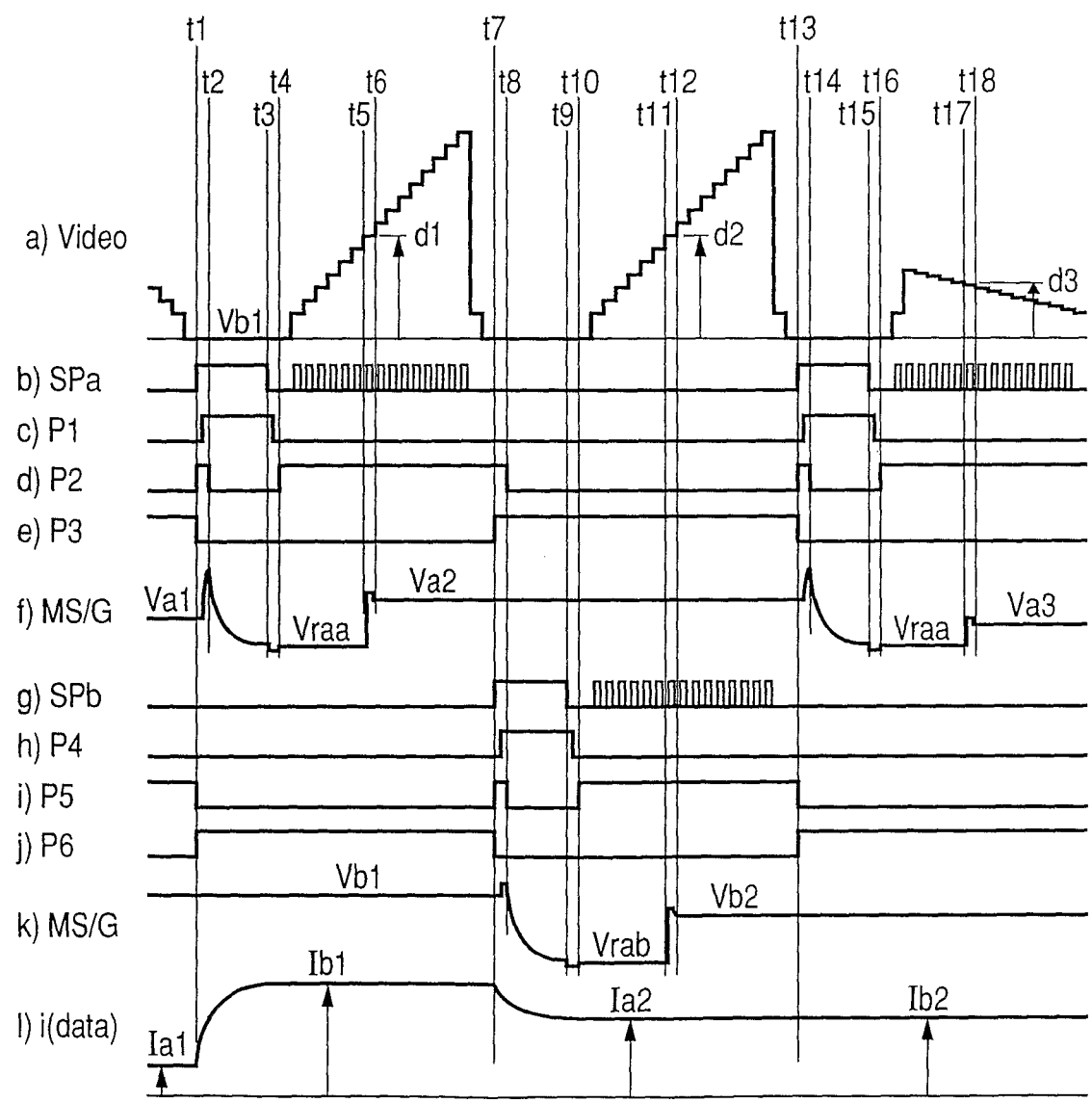
FIG. 14 is a timing chart of the operation of the column-current generating circuit of FIG. 13.

FIGS. 1 and 2 schematically illustrate this embodiment where column-current generating circuits as illustrated in FIG. 13 are produced as a designed pattern. FIGS. 3 and 4 schematically illustrate patterns of column-current generating circuits shown as a comparative example. Note that FIGS. 1 and 3 are circuit diagrams of a single column-current generating circuit, whereas FIGS. 2 and 4 are circuit diagrams of three column-current generating circuits for displaying a color image in three colors (RGB).

The difference between the column-current generating circuit of this embodiment illustrated in FIG. 1 and the column-current generating circuit of the comparative example lies in that each of the transistors M3 and M9 is realized by a single transistor device in FIG. 3, whereas each of the transistors M3 and M9 is realized by three transistor devices in FIG. 1. The transistors M3 and M9 are adapted to retain a signal as an electric potential of the gate that operates as a control electrode and output a signal current that corresponds to the electric potential. The transistors including the transistors M3 and M9 of the column-current generating circuit have an active layer made of non-single-crystal semiconductor, which is p-Si, and formed on a substrate having an insulating surface such as a glass substrate or a resin substrate.

Figure 15:
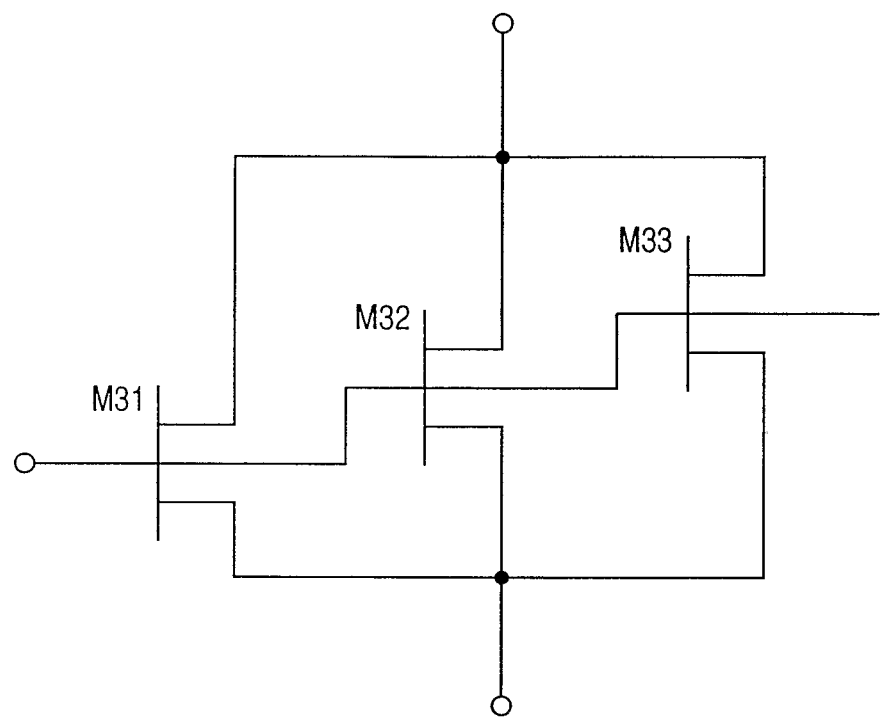
FIG. 15 is a schematic circuit diagram of three transistor devices connected in parallel.

In the embodiment illustrated in FIG. 1, the transistor M3 is realized by three transistor devices M31, M32 and M33 that are arranged in a distributed manner. As illustrated in FIG. 15, the gates that operate as a control electrode and the sources and the drains that operate as two main electrodes of the transistor devices M31, M32 and M33 are respectively connected commonly in parallel. The transistor devices M31, M32 and M33 are arranged at the pitch of alignment of the EL devices in the row direction (in the Y-direction in FIG. 1) and a constant pitch in the column direction of alignment (in the X-direction of FIG. 1). Thus, influence of fluctuations of the grain boundaries of p-Si can be alleviated by forming the transistor M3 by means of three transistor devices M31, M32 and M33 arranged in parallel in a distributed manner. While the transistor M3 is formed by three distributed transistor devices in this embodiment, it is sufficient that the transistor M3 is formed by two or more than two transistors. The number of distributed transistor devices is determined appropriately by considering the period of fluctuations of the grain boundaries of p-Si, the increase of the dedicated area and other factors.

The number of transistor devices that form the transistor M9 is the same as the number of the transistor devices forming the transistor M3. The transistor M9 is hence formed by three transistor devices M91, M92 and M93 in this embodiment.

In the embodiment illustrated in FIG. 2, the transistors MB3, MG3 and MR3 of FIG. 4 are formed by respective groups of three transistor devices MB31 through MB33, MG31 through MG33, and MR31 through MR33 that are arranged in a distributed manner. Similarly, the transistors MB9, MG9 and MR9 are formed by respective groups of three transistor devices MB91 through MB93, MG91 through MG93, and MR91 through MR93.

Figure 5:
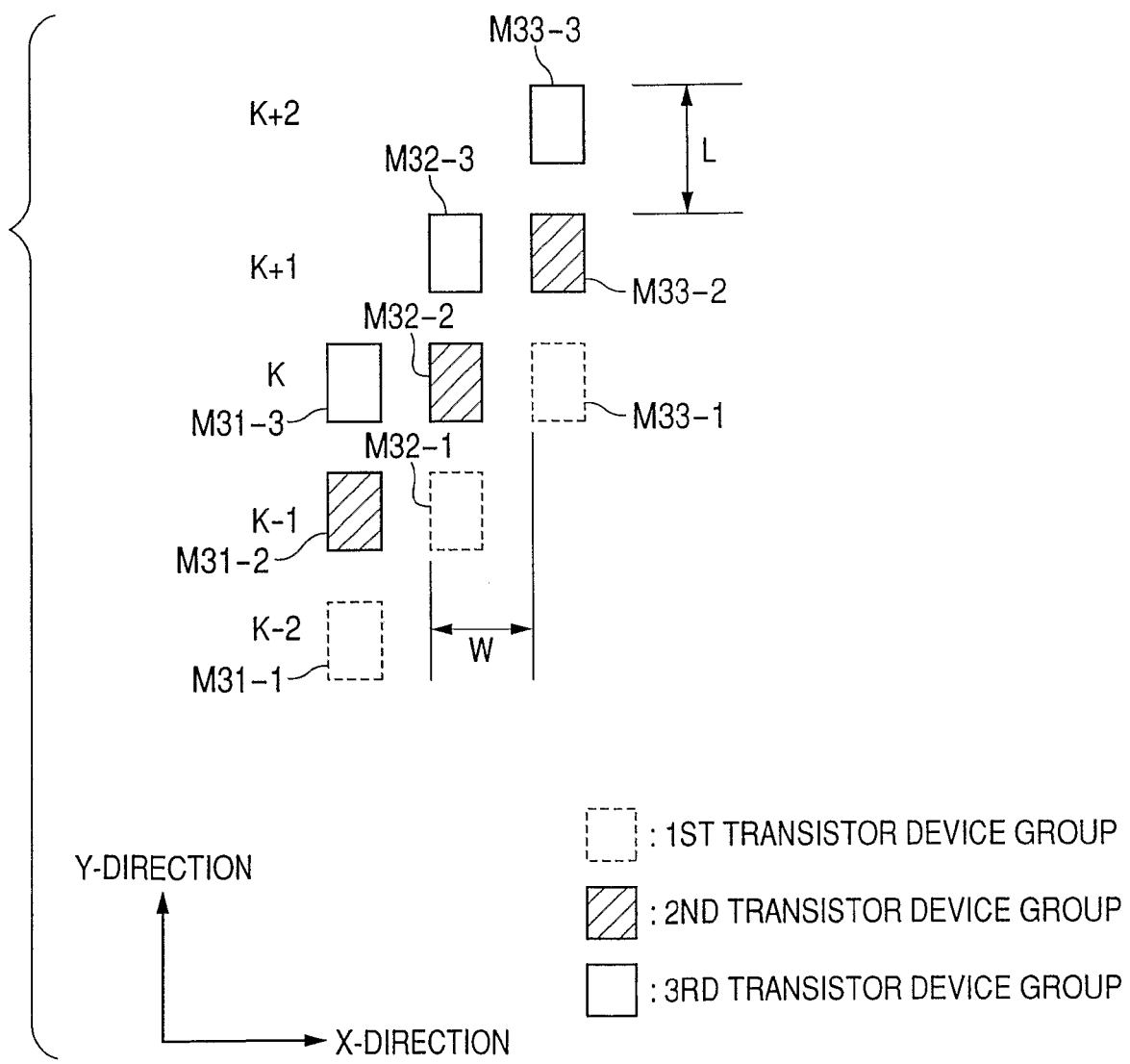
FIG. 5 is a schematic illustration of the arrangement of transistor devices in an embodiment of the present invention, illustrating the configuration thereof.
Figure 6:
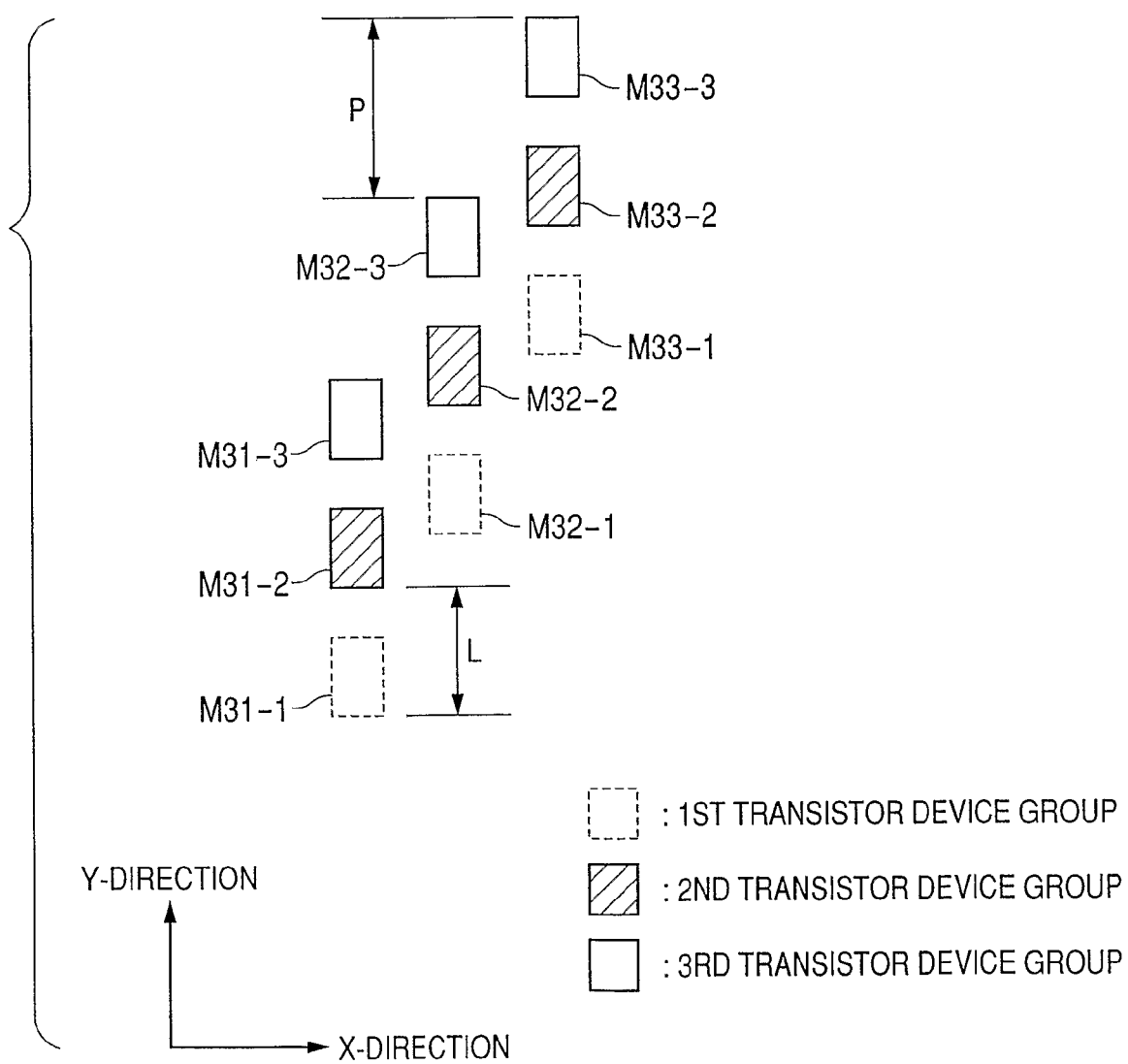
FIG. 6 is a schematic illustration of the arrangement of transistor devices of a comparative example.

Now, the effect of distributing three transistor devices at the pitch equal to the period of alignment of EL devices in the row direction will be discussed further by referring to FIGS. 5 and 6. FIG. 5 is a schematic illustration of the arrangement of transistor devices in this embodiment, illustrating the configuration thereof. FIG. 6 is a schematic illustration of the arrangement of transistor devices of a comparative example. Note that transistor devices are indicated by squares in FIGS. 5 and 6 for the purpose of simplification.

Each of the transistors M3 of three columns is formed by a group of three transistor devices. In FIGS. 5 and 6, the transistor devices of the first transistor device group are referred to as M31-1, M32-1 and M33-1 and the transistor devices of the second transistor device group are referred to as M31-2, M32-2 and M33-2, while the transistor devices of the third transistor device group are referred to as M31-3, M32-3 and M33-3.

As illustrated in FIG. 5, the transistors are arranged in the Y-direction (row direction of alignment) at the pitch "L" which is equal to the alignment period of EL devices in the row direction. For instance, the transistor device M32-1 of the first transistor device group is displaced from the transistor device M31-1 of the same group by the pitch "L" in the Y-direction and the transistor device M33-1 of the same group is displaced from the transistor device M32-1 by the same pitch "L".

Thus, the transistor devices are linearly arranged in the Y-direction (row direction of alignment). The transistor devices M31-1, M32-1 and M33-1 of the first transistor device group are arranged respectively at the positions of column K−2, column K−1 and column K and the transistor devices M31-2, M32-2 and M33-2 of the second transistor device group are arranged respectively at the positions of column K−1, column K and column K+1, whereas the transistor devices M31-3, M32-3 and M33-3 of the third transistor device group are arranged respectively at the positions of column K, column K+1 and column K+2.

A transistor device of a transistor device group is arranged at the same column as a transistor device of other transistor device groups. For example, as for column K, the transistor devices M31-3, M32-2 and M33-1 are arranged at the same column K. In other words, transistor devices of the first through third transistor device groups are arranged at the same column. From the viewpoint of fluctuations of the grain boundaries of p-Si in the Y-direction, the transistor devices M31-3, M32-2 and M33-1 show substantially the same or similar fluctuations of the grain boundaries in the Y-direction because the transistor devices M31-3, M32-2 and M33-1 are arranged in the X-direction in the same column. Therefore, the added electric current of each transistor device group is highly correlated with the added electric currents of other transistor device groups.

On the other hand, if the extent "P" of displacement of the three transistor devices of each group is made greater than the pitch "L" (P>L) as illustrated in FIG. 6, transistor devices of different groups are not linearly aligned in the X-direction. For example, as for the transistor devices M31-3, M32-2 and M33-1, the transistor device M31-3 and the transistor device M32-2 partly overlap each other in the X-directional alignment but the transistor device M31-3 and the transistor device M33-1 do not overlap each other at all. Therefore, the added electric current of each transistor device group is less correlated with the added electric currents of other transistor device groups if compared with the arrangement of FIG. 5.

Transistor devices, however, do not necessarily be displaced at the same pitch of arrangement of luminescent devices in the row direction. In other words, transistor devices may be displaced at a pitch that is n times (n being a natural number not smaller than two) of the period of alignment of luminescent devices. Since the period of alignment of luminescent devices is varied as a function of the resolution of the display apparatus, the pitch of arrangement of transistor devices is made equal to n times (n being a natural number not smaller than two) of the period of alignment of luminescent devices when the period of fluctuations of the grain boundaries of p-Si is greater than the period of alignment of luminescent devices. Hence, the extent of displacement of transistor devices is made smaller than the period of fluctuations of the grain boundaries of p-Si by doing so.

Figure 16:
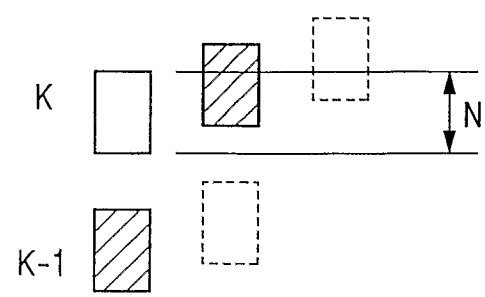
FIG. 16 is a schematic illustration of another arrangement of transistor devices in an embodiment of the present invention, illustrating the configuration thereof.

The above-described effect of this embodiment occurs when the extent of displacement of transistor devices does not completely agree with the period or n times of the period of alignment of luminescent devices in the row direction. More specifically, the above-described effect occurs when each transistor device group is formed in such a way that the regions for forming two or more than two adjacent transistor devices of different transistor device groups overlap in the width "N" of each transistor device forming region (the source/drain region and the channel region) as illustrated in FIG. 16. Thus, in this patent application, the expression "the plurality of transistor devices being arranged at a pitch equal to or n times (n being a natural number not smaller than two) of the period of alignment in the row direction of the plurality of luminescent devices" includes a mode or arrangement as illustrated in FIG. 16.

As pointed out above, when forming a transistor that is required to show a high response speed by means of a thin film transistor (TFT), p-Si that shows an electron mobility higher than a-Si is desirably used. When forming a polysilicon layer on an insulating substrate such as a glass substrate, generally, the substrate is irradiated with a laser beam such as an excimer laser beam in order to heat and melt a-Si on the substrate and recrystallize a-Si into p-Si.

When forming distributed transistor devices of the column-current generating circuits of this embodiment by means of polysilicon produced by irradiating a laser beam, the transistor devices are desirably distributed both in the direction of the laser beam length and in the scanning direction. When forming polycrystal by irradiating an amorphous semiconductor such as amorphous silicon with a laser beam such as an excimer laser beam, an amorphous semiconductor layer 12 is irradiated with a laser beam 11 adapted to produce a belt-shaped irradiation surface and is moved in the scanning direction. In this process, the grain boundaries of the polycrystal produce dispersion in the scanning direction of the laser beam 11 and in the direction perpendicular to the scanning direction (in the direction of the laser beam length).

Figure 9:
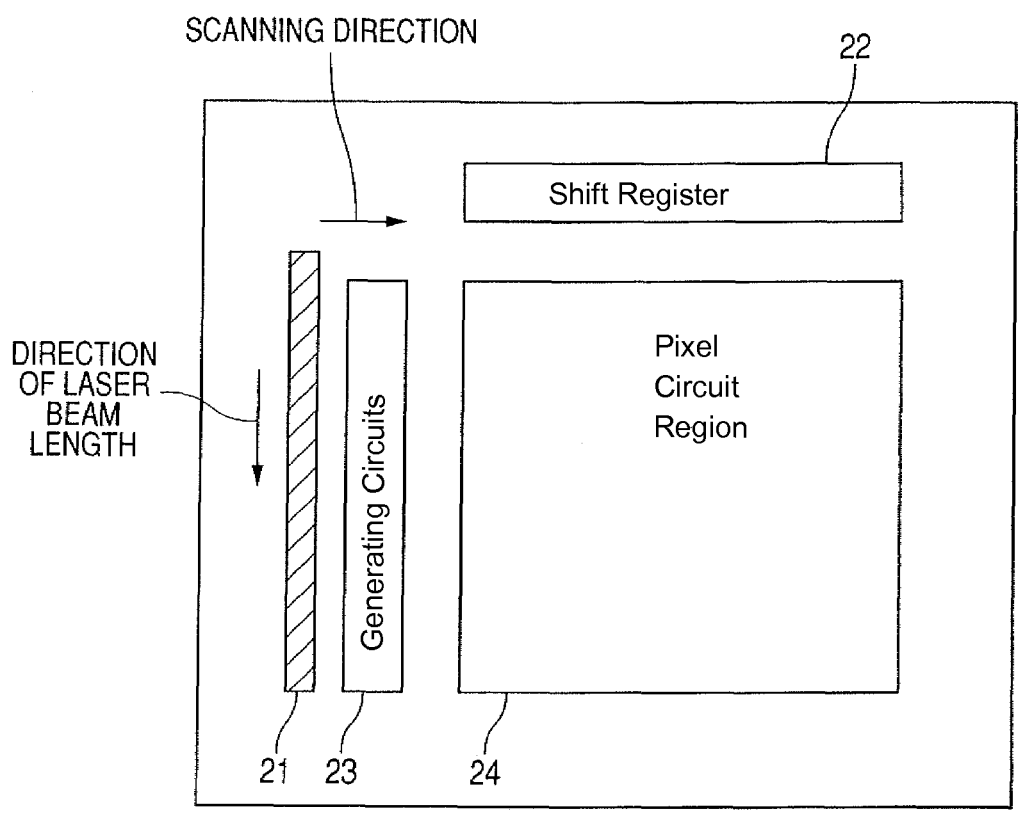
FIG. 9 is a schematic illustration of a method of polycrystallizing amorphous silicon when using polysilicon for the transistors of the column-current generating circuits of a display apparatus.

Referring to FIG. 9, when polysilicon is used for the transistors of column-current generating circuits 23 of this embodiment, an amorphous semiconductor layer such as an amorphous silicon layer is formed on an insulating substrate such as a glass substrate and a laser beam is made to scan the substrate in the scanning direction indicated by an arrow in FIG. 9. FIG. 9 illustrates a laser beam 21, a vertical shift register 22, and a region 24 where pixel circuits are formed.

When the non-single-crystal semiconductor layers of the transistor devices M31 through M33, and M91 through M93 of FIG. 1 are formed by polysilicon, they are formed by scanning a laser beam in the scanning direction illustrated in FIG. 9. At this time, the X-direction and the Y-direction, or the Y-direction and the X-direction, in FIG. 1 are desirably made to coincide with the scanning direction and the direction of the laser beam length respectively. With such an arrangement, dispersion of the characteristics of the transistors can be suppressed that are produced by the dispersion of the grain boundaries of polycrystal in the scanning direction and in the direction perpendicular to the scanning direction (in the direction of the laser beam length). Note, however, it is not necessary to make the row direction of alignment and the column direction of alignment of EL devices completely agree with the scanning direction of the laser beam and the direction of the laser beam length respectively. The row direction of alignment and the column direction of alignment can be displaced from the scanning direction of the laser beam and the direction of the laser beam length respectively due to factors involved in designing and manufacturing the device. Thus, for the purpose of the present patent application, the expression "coinciding" includes dispersions that can be deemed to be practically coinciding.

The dispersion of the characteristics of transistors can be produced not only factors involved in the radiation of a laser beam but also those involved in other manufacturing steps. The arrangement of this embodiment described above by referring to FIGS. 1 through 6 can also suppress the dispersion of the electric characteristics of transistors produced by factors involved in manufacturing steps other than the irradiation of a laser beam. Thus, the arrangement of this embodiment is applicable regardless of the scanning direction of a laser beam.

Figure 7:
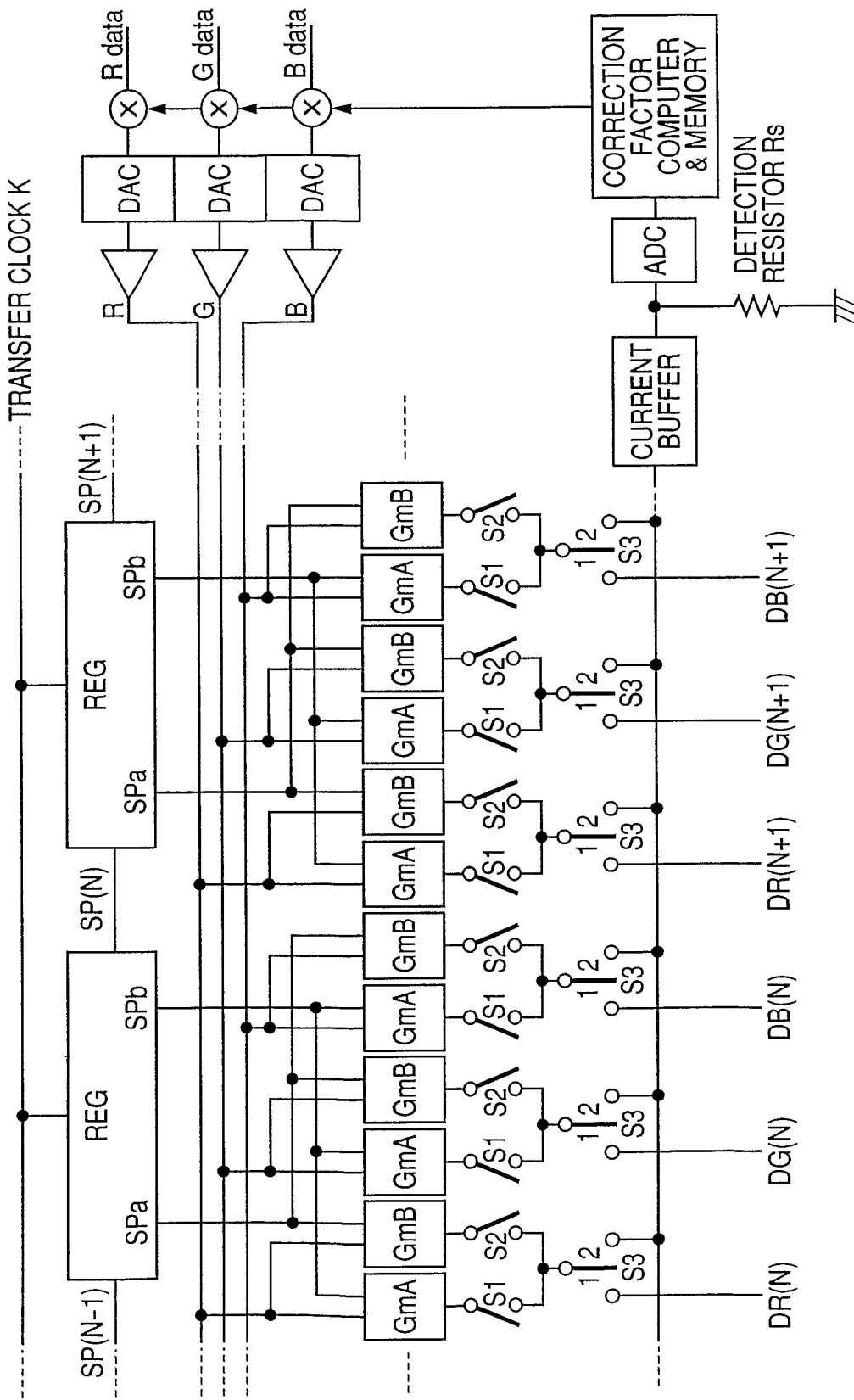
FIG. 7 is a schematic illustration of a circuit for detecting the dispersion of column-currents and uniformizing the column-currents by means of a total current detection method.
Figure 8:
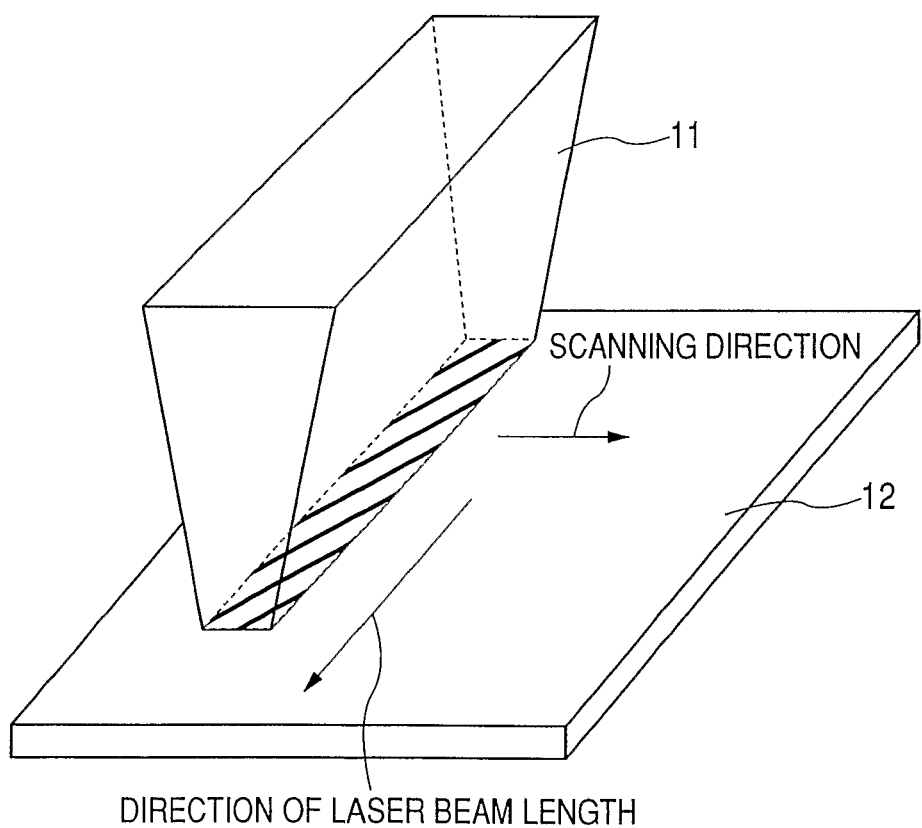
FIG. 8 is a schematic illustration of a method of polycrystallizing amorphous silicon.

The dispersion of column currents can be detected and uniformized by means of a total current detection method. FIG. 7 is a schematic illustration of a circuit for detecting the dispersion of column-currents and uniformizing them by means of a total current detection method. For a total current detection method, uniformization of the voltage-current conversion characteristics of adjacent six column-current generating circuits is important and the configuration of the column-current generating circuits of this embodiment can suitably be used with the method.

In FIG. 7, GmA and GmB are column-current generating circuits (Gm) similar to those illustrated in FIG. 13 and FIG. 2. In a normal operation, switches S3 are turned to the "1" side, while switches S1 and S2 operate as toggle switches so that a signal current is supplied to each column from either GmA or GmB of the corresponding column-current generating circuit. On the other hand, in a total current detecting operation, switches S3 are turned to the "2" side and both switches S1 and switches S2 are turned on. Then, an electric current is supplied to a common line from the six column-current generating circuits (Gm), each having GmA and GmB and the total current flows to detection resistor Rs by way of a current buffer. The voltage of the detection resistor Rs is converted into a digital signal by way of a digital/analog converter (ADC) and subjected to a correction coefficient computation process so that the data signals "Rdata", "Gdata", "Bdata" are multiplied by a factor to correct the dispersion of the column-currents. The corrected data signals are input to the column-current generating circuits (Gm) by way of a digital/analog converter (DAC) and an amplifier.

The display apparatus of this embodiment is by no means limited to an EL display apparatus so long as the functional devices are electrooptic devices that are made to emit light or electrons by means of an electric current. Examples of such devices include organic EL devices and surface conduction electron-emitting devices. As pointed out above, the functional devices may be transistor circuits (pixel circuits) or transistor devices. The above embodiment is described in terms of an active matrix type display apparatus where an active device such as a transistor is arranged for each pixel and the luminescent devices are controlled by way of the active devices. However, a column-current generating circuit according to the present invention can also be applied to a passive matrix type display apparatus where column-current generating circuits directly supply electric currents to luminescent devices.

(Second Embodiment)

A display apparatus as described above by way of the first embodiment can be used to form an information processing apparatus. Such an information processing apparatus may be a portable telephone set, a portable computer, a still camera, a video camera or a multi-functional apparatus that operates as many such apparatus. An information processing apparatus according to the present invention has an information input section. In the case of a portable telephone set, the information input section includes an antenna. In the case of a PDA or a portable computer, the information input section includes an interface section for a network. In the case of a still camera or a movie camera, the information input section includes a sensor section (image pickup section) realized by means of a CCD or a CMOS.

Now, a digital camera including a display apparatus of the above-described first embodiment will be described below as an embodiment of the present invention.

Figure 10:
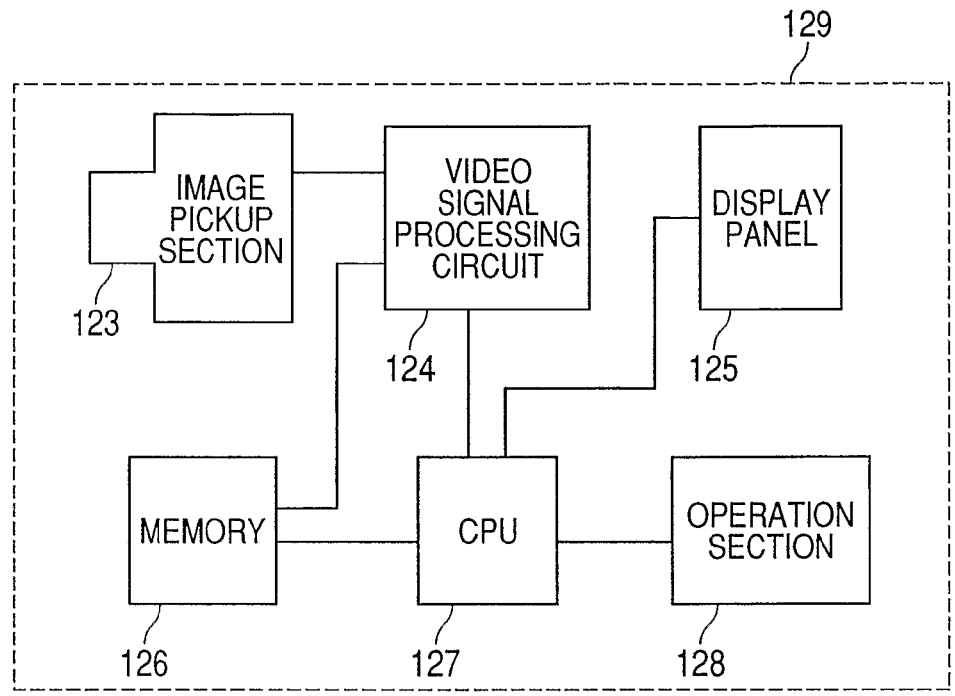
FIG. 10 is a schematic block diagram of an exemplar digital still camera.

FIG. 10 is a schematic block diagram of a digital still camera. FIG. 10 illustrates an entire camera system 129, an image pickup section 123 for picking up an image of a subject, a video signal processing circuit 124, a display panel 125, a memory 126, a CPU 127 and an operation section 128. The signals of the image picked up by the image pickup section 123 or recorded in the memory 126 are processed by the video signal processing circuit 124 and the image can be viewed on the display panel 125. The CPU 127 controls the image pickup section 123, the memory 126, the video signal processing circuit 124 and so on according to the input from the operation section 128 for an image pickup operation, a recording operation, a replay operation, a display operation appropriately.

The present invention is not limited to the above embodiments and various changes and modifications can be made within the spirit and scope of the present invention. Therefore to apprise the public of the scope of the present invention, the following claims are made.

This application claims priority from Japanese Patent Application No. 2006-181666 filed on Jun. 30, 2006, which is hereby incorporated by reference herein.

The invention claimed is:

1. A display apparatus comprising:
a plurality of luminescent devices aligned periodically in a row direction and in a column direction;
a plurality of pixel circuits aligned periodically in the row direction and in the column direction for supplying an electric current to each of the luminescent devices;
a plurality of data lines each connected commonly to the pixel circuits aligned periodically in the column direction for supplying signal currents to these pixel circuits; and
a plurality of column-current generating circuits connected to the plurality of data lines respectively for supplying signal currents to the corresponding data lines,
each of the column-current generating circuits having a plurality of transistor devices,
each of the plurality of transistor devices having a gate that operates as a control electrode and a source and a drain that operate as main electrodes,
with the gates, the sources and the drains respectively of the plurality of transistor devices being connected commonly in parallel,
the plurality of transistor devices being capable of retaining a signal as an electric potential of the commonly connected control electrodes and outputting a signal current corresponding to the electric potential from the commonly connected main electrodes,
wherein each of the transistor devices includes a semiconductor layer formed into polycrystalline by irradiating an amorphous semiconductor layer with a laser beam having an elongated irradiation surface such that the elongated irradiation surface scans the amorphous semiconductor layer in the column direction, with the elongated irradiation surface having a longitudinal direction in the row direction, and
wherein the plurality of transistor devices in each of the column-current generating circuits are arranged in an offset manner in more than a single row and more than a single column.

2. The apparatus according to claim 1, wherein each of the column-current generating circuits has a signal input terminal connected to the control electrodes of the plurality of transistor devices by way of a capacitor.

3. The apparatus according to claim 1, wherein the luminescent devices are electroluminescent devices.

4. An information processing apparatus comprising a display apparatus according to claim 1, an image pickup section for picking up an image of a subject and a video signal processing circuit for processing a video signal of the image picked up by the image pickup section,
the video signal processed by the video signal processing circuit being displayed on the display apparatus.

5. A display apparatus according to claim 1, wherein the semiconductor layer of one of the plurality of transistor devices included in each of the column-current generating circuits partly overlaps the semiconductor layer of one of the plurality of transistor devices included in an adjacent one of the column-current generating circuits in the column direction.

6. A display apparatus according to claim 1, wherein the polycrystalline semiconductor layer includes grain boundaries dispersed in both the column direction and the row direction.

7. A display apparatus comprising:
a plurality of luminescent devices aligned periodically in a row direction and in a column direction;

a plurality of pixel circuits aligned periodically in the row direction and in the column direction for supplying an electric current to each of the luminescent devices;

a plurality of data lines each connected commonly to the pixel circuits aligned periodically in the column direction for supplying signal currents to these pixel circuits; and a plurality of column-current generating circuits connected to the plurality of data lines respectively for supplying signal currents to the corresponding data lines, each of the column-current generating circuits having a plurality of transistor devices, each of the plurality of transistor devices having a gate that operates as a control electrode and a source and a drain that operate as main electrodes, with the gates, the sources and the drains respectively of the plurality of transistor devices being connected commonly in parallel, the plurality of transistor devices being capable of retaining a signal as an electric potential of the commonly connected control electrodes and outputting a signal current corresponding to the electric potential from the commonly connected main electrodes, wherein each of the transistor devices includes a semiconductor layer formed into polycrystalline and having grain boundaries dispersed in both the column direction and the row direction, and wherein the plurality of transistor devices in each of the column-current generating circuits are arranged in an offset manner in more than a single row and more than a single column.

8. The apparatus according to claim 7, wherein each of the column-current generating circuits has a signal input terminal connected to the control electrodes of the plurality of transistor devices by way of a capacitor.

9. The apparatus according to claim 7, wherein the luminescent devices are electroluminescent devices.

10. An information processing apparatus comprising a display apparatus according to claim 7, an image pickup section for picking up an image of a subject and a video signal processing circuit for processing a video signal of the image picked up by the image pickup section, the video signal processed by the video signal processing circuit being displayed on the display apparatus.

11. A display apparatus according to claim 7, wherein the semiconductor layer of one of the plurality of transistor devices included in each of the column-current generating circuits partly overlaps the semiconductor layer of one of the plurality of transistor devices included in an adjacent one of the column-current generating circuits in the column direction.

* * * * *